United States Patent
Yu et al.

(10) Patent No.: US 12,372,865 B2
(45) Date of Patent: Jul. 29, 2025

(54) STAMP FOR MICRO-TRANSFER PRINTING

(71) Applicant: ROCKLEY PHOTONICS LIMITED, Altrincham (GB)

(72) Inventors: Guomin Yu, Glendora, CA (US); Aaron John Zilkie, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 167 days.

(21) Appl. No.: 18/056,239

(22) Filed: Nov. 16, 2022

(65) Prior Publication Data

US 2023/0259022 A1 Aug. 17, 2023

(30) Foreign Application Priority Data

Nov. 18, 2021 (GB) .................................. 2116619

(51) Int. Cl.
  *G03F 7/00* (2006.01)
  *B29C 33/38* (2006.01)
  *B29C 33/40* (2006.01)

(52) U.S. Cl.
  CPC ........ *G03F 7/0002* (2013.01); *B29C 33/3842* (2013.01); *B29C 33/40* (2013.01); *B29K 2883/00* (2013.01)

(58) Field of Classification Search
  None
  See application file for complete search history.

(56) References Cited

U.S. PATENT DOCUMENTS

| | | | |
|---|---|---|---|
| 2008/0000375 A1* | 1/2008 | Nielsen | B81C 99/009 101/450.1 |
| 2016/0016399 A1* | 1/2016 | Bower | H01L 21/3065 101/287 |
| 2017/0047306 A1 | 2/2017 | Meitl et al. | |
| 2017/0173852 A1* | 6/2017 | Moore | H01L 21/7806 |
| 2020/0144092 A1 | 5/2020 | Radauscher et al. | |
| 2021/0193500 A1* | 6/2021 | Moore | H01L 21/67706 |
| 2021/0300098 A1* | 9/2021 | Moore | G03F 7/0002 |
| 2023/0059174 A1* | 2/2023 | Purchase | H01L 24/75 |
| 2023/0197479 A1* | 6/2023 | Benkendorfer | H01L 21/67144 438/106 |

OTHER PUBLICATIONS

UK Intellectual Property Office. "Combined Search and Examination Report for Application No. 2116619.4 (GB 2612986)". May 17, 2022. (Year: 2022).*

U.K. Intellectual Property Office Search and Examination Report, dated May 17, 2022, for Patent Application No. GB2116619.4, 6 pages.

\* cited by examiner

*Primary Examiner* — Susan D Leong
*Assistant Examiner* — Jonathan B Woo
(74) *Attorney, Agent, or Firm* — Womble Bond Dickinson (US) LLP

(57) ABSTRACT

A stamp suitable for use in a micro-transfer printing process. The stamp comprises: a carrier layer; a plurality of stamp base sections, wherein: each stamp base section is attached on a first surface to the carrier layer, and separated from each adjacent stamp base section by a gap; and each stamp base section includes one or more stamping posts, for adhering to a source coupon, each stamping post extending from a second surface of its respective stamp base section.

18 Claims, 3 Drawing Sheets

STAMP FOR MICRO-TRANSFER PRINTING

CROSS-REFERENCE TO RELATED APPLICATION(S)

This application claims priority to United Kingdom Patent Application No. 2116619.4, filed in the United Kingdom Intellectual Property Office on Nov. 18, 2021, entitled "STAMP FOR MICRO-TRANSFER PRINTING", which is incorporated by reference herein in its entirety.

FIELD OF THE INVENTION

The present invention relates to a stamp suitable for use in a micro-transfer printing process, a method of preparing the stamp, a mould for preparing the stamp, a method of manufacturing an optoelectronic device using the stamp, and an optoelectronic device manufactured according to the method of manufacture.

BACKGROUND

Hybrid integration of III-V semiconductor based electro-optical devices (e.g. lasers, modulators, and amplifiers), with silicon-on-insulator (SOI) platforms confers the advantage of combining the best parts of both materials systems.

Conventional chip bonding processes typically use flip-chip bonding, in which the III-V semiconductor based device is inverted and bonded into a cavity on the SOI platform. However this manufacturing process can be costly and have a low yield, because of the metal bumping requirements for the die bonding and difficulties in accurately controlling the alignment of the respective components.

Micro-transfer printing (MTP) is therefore being investigated as an alternative way to integrate III-V semiconductor based devices within an SOI wafer. In these methods, the III-V semiconductor based device is fabricated on a device wafer. It can then be picked up using a stamp, typically formed of elastomer, and printed into a cavity on the SOI wafer in the same orientation in which it was manufactured and without the need for metal bumping.

However the conventional polydimethylsiloxane, PDMS, stamp used in MTP has a large coefficient of thermal expansion (CTE) of around $3.2 \times 10^{-4}$ $K^{-1}$. The CTE of PDMS is around 100 times larger than the CTE glass plate which holds the PDMS stamp ($9.5 \times 10^{-6}$ $K^{-1}$ for Soda lime glass or $5.5 \times 10^{-7} K^{-1}$ for quarts glass), the CTE of the SOI wafer ($2.6 \times 10^{-6} K^{-1}$), or the CTE of the III-V device wafer. This huge CTE difference causes significant errors in MTP alignment, which reduces the yield during mass manufacturing. FIGS. 1A and 1B show plots of the expansion of a PDMS stamp in μm as a function of stamp base length given an assumed temperature change.

SUMMARY

Accordingly, in a first aspect, embodiments of the invention provide a stamp, suitable for use in a micro-transfer printing process, the stamp comprising:
  a carrier layer;
  a plurality of stamp base sections, wherein:
    each stamp base section is attached on a first surface to the carrier layer, and separated from each adjacent stamp base section by a gap; and
    each stamp base section includes one or more stamping posts, for adhering to a source coupon, each stamping post extending from a second surface of its respective stamp base section.

By providing such a stamp, the effects of the thermal expansion can be minimised and so alignment during the MTP process improved. Examples of a stamp according to the present invention can allow an alignment accuracy of <0.5 μm.

The stamp may have any one or, to the extent that they are compatible, any combination of the following optional features.

The gaps between each of the adjacent stamp base sections may be a same size. The gaps between each of the adjacent stamp base sections may be respectively different sizes.

The stamp base sections may be arranged in a stamp base array. The gaps between each of the adjacent stamp base sections may align to define a plurality of streets through the stamp base array.

The respective stamping posts may be arranged in a post array, and the or each stamping post may be separated from the stamping posts of the adjacent stamp base sections by a stamping post gap. Each of the stamping post gaps between the stamping posts of the adjacent stamp base sections may be a same size. Each of the stamping posts gaps between the stamping posts of the adjacent stamp base sections may be respectively different sizes.

There may be only one stamping post attached to each second surface of each of the stamp base sections. Each stamping post may be attached to the second surface of a respective stamp base section in a central position of the second surface.

A plurality of stamping posts may be attached to each second surface of each of the stamp base sections. The number of stamping posts attached to each of the second surfaces of each of the stamp base sections may be either the same or not the same. The number of stamping posts attached to each of the second surfaces of each of the stamp base sections may be respectively different.

Each stamp base section may have either a same cross-sectional area or respectively different cross-sectional areas, each cross-sectional area being an area of the second surface of each of the stamp base sections, wherein the cross-sectional area may be measured in a direction perpendicular to a direction in which the or each stamping post extends.

Each of the stamp base sections may have either a same volume or respectively different volumes.

The second surface of each of the stamp base sections may be rectangular, and may be square. A length of each side of each of the stamp base sections may be at least 1 millimetre and no more than 5 millimetres.

A combined depth of each stamp base section and its respective one or more stamping posts may be at least 3 millimetres and no more than 4 millimetres.

The stamp base gaps may have a minimum size that is at least 50 microns and no more than 100 microns.

Each of the stamping posts may extend away from its respective stamp base section, defining a depth of each of the stamping posts, wherein the depth of each of the stamping posts may be at least 50 microns and no more than 100 microns.

The carrier layer may be formed of glass. A coefficient of thermal expansion of the carrier layer may be no more than $1 \times 10^{-5}$ $K^{-1}$.

Each stamp base section may be formed from polydimethylsiloxane, PDMS. The or each stamping post may be formed of PDMS.

In a second aspect, embodiments of the invention provide a method of preparing a stamp according to the first aspect, the method comprising the steps of:

depositing a liquid precursor into a mould, the mould comprising a carrier layer and a fixed layer defining a shape of the plurality of stamping posts and a stamp base precursor;

wherein on one sidewall of the mould, the carrier layer contacts the liquid precursor to form the stamp base precursor and on the opposite sidewall of the mould, the fixed layer, containing pre-etched cavities, contacts the liquid precursor to form the posts;

solidifying the liquid precursor to form a solid stamp precursor attached to the carrier layer; and removing material from the solid stamp precursor to define the plurality of stamp base sections with gaps therebetween.

Removing material from the solid stamp precursor may involve cutting material away with a laser.

The fixed layer may be a silicon wafer.

In a third aspect, embodiments of the invention provide a mould suitable for use in the method of the second aspect, the mould being suitable for preparing a stamp according to the first aspect, the mould defining the shape of the plurality of stamping posts and the stamp base precursor.

In a fourth aspect, embodiments of the invention provide a method of manufacturing an optoelectronic device using the stamp of the first aspect, the method comprising the steps of:

adhering a respective source coupon onto the or each stamping post; and printing the respective source coupon(s) onto a target wafer, by pressing the stamp onto the target wafer to deposit the source coupon(s) onto the target wafer.

The respective source coupon(s) may be formed from a III-V semiconductor. The target wafer may be a silicon-on-insulator wafer.

The method may include adhering a respective source coupon onto each of a plurality of stamping posts, and separating the target substrate, with the deposited source coupons, into a plurality of optoelectronic devices. Separating the target substrate into a plurality of optoelectronic devices may include dicing the target substrate into sections corresponding to each of the stamp base sections of the stamp. Separating the target substrate into a plurality of optoelectronic devices may include cutting, with a laser, the target substrate into sections corresponding to each of the stamp base sections of the stamp.

In a fifth aspect, embodiments of the invention provide an optoelectronic device manufactured according to the method of the fourth aspect.

The invention includes the combination of the aspects and preferred features described except where such a combination is clearly impermissible or expressly avoided.

Further aspects of the present invention provide: a computer program comprising code which, when run on a computer, causes the computer to perform the method of the second or fourth aspects; a computer readable medium storing a computer program comprising code which, when run on a computer, causes the computer to perform the method of the second or fourth aspects; and a computer system programmed to perform the method of the second or fourth aspects.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Aspects and embodiments of the present invention will now be discussed with reference to the accompanying figures. Further aspects and embodiments will be apparent to those skilled in the art.

Figure 1A:
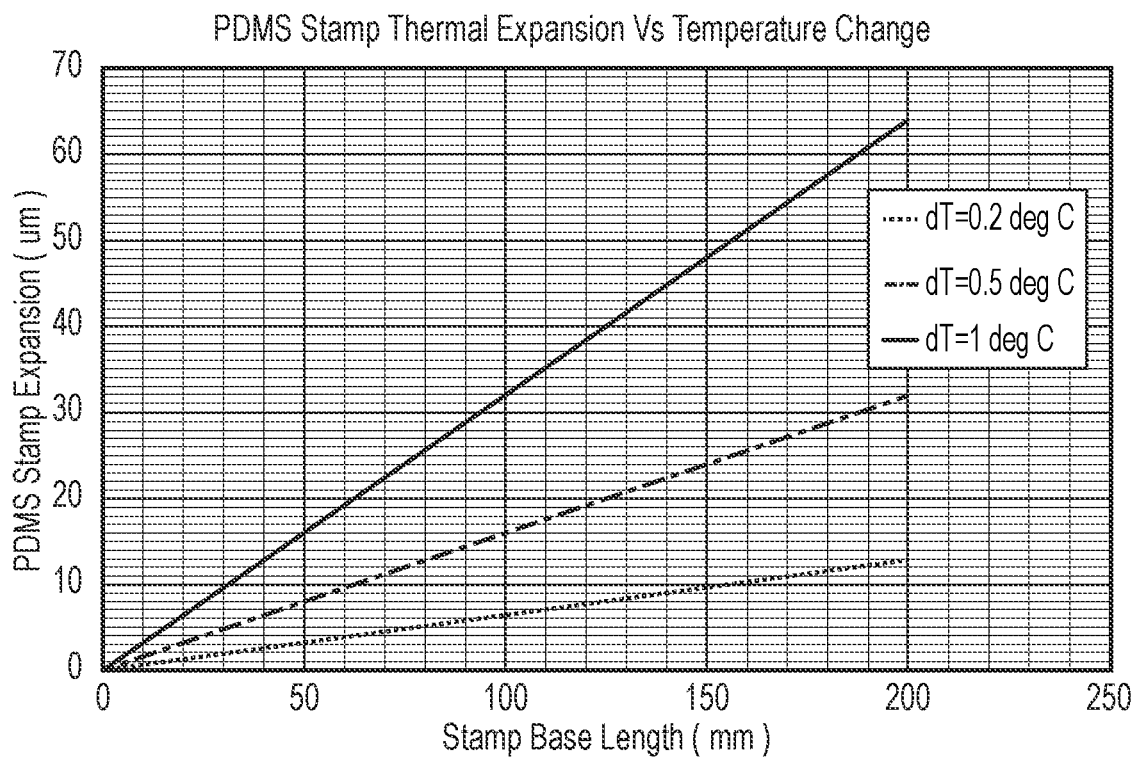
FIGS. 1A and 1B show plots of the expansion of a PDMS stamp in μm as a function of stamp base length given an assumed temperature change.
Figure 1B:
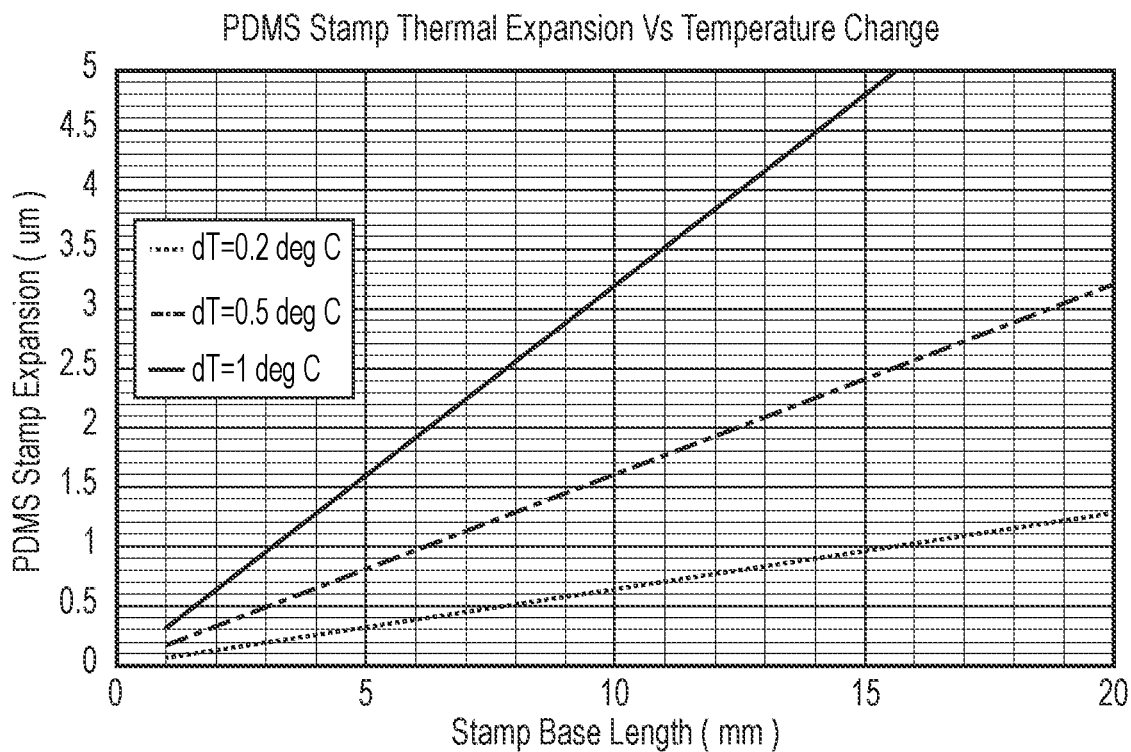
Figure 2A:
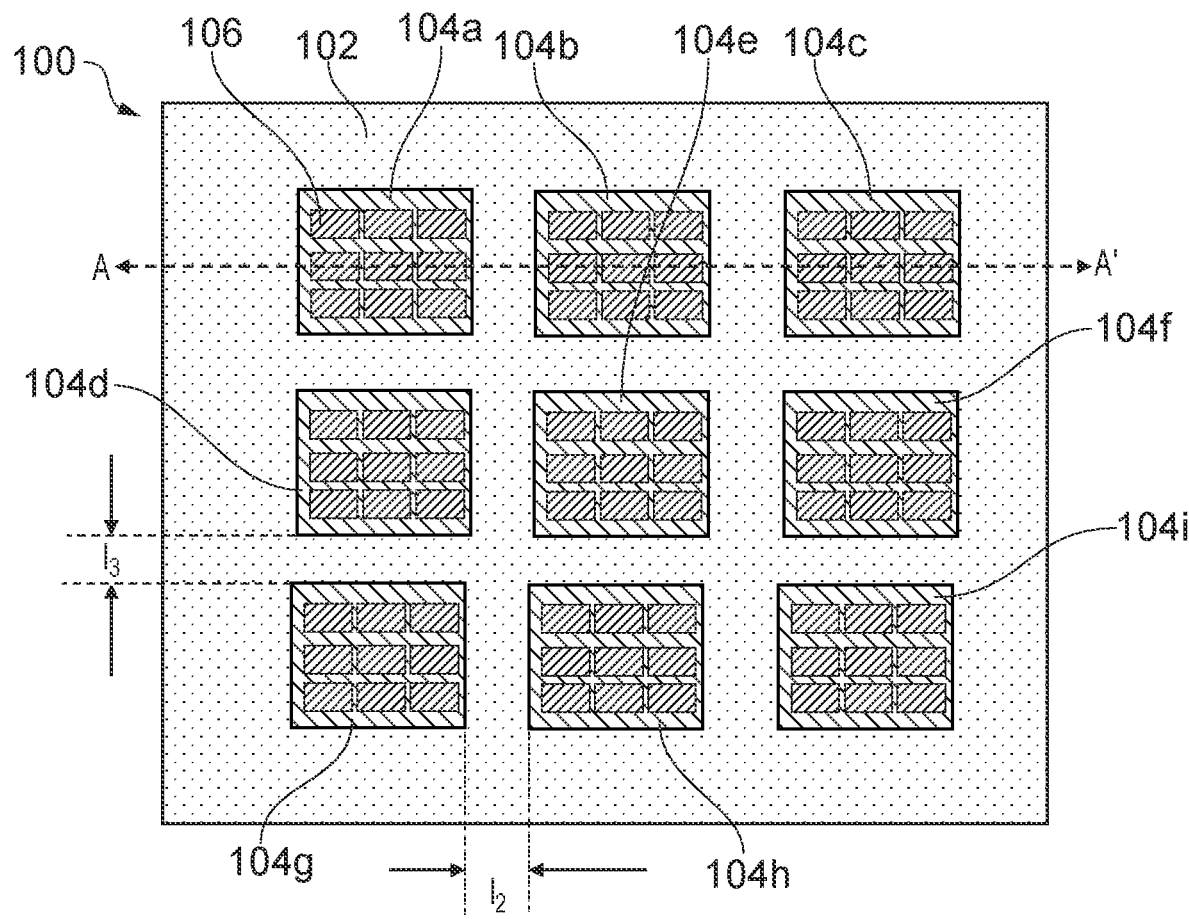
FIG. 2A shows a bottom-up view of a stamp according to an embodiment of the present invention.

FIG. 2A shows a bottom-up view of a stamp 100 according to an embodiment of the present invention. The stamp comprises a carrier layer 102, in this example formed from glass with a CTE of less than $1 \times 10^{-5} K^{-1}$. The carrier layer is attached to a plurality of stamp base sections 104a-104i, in this example each being made of PDMS. The stamp base sections are attached at a first surface to the carrier layer, and are separated from each other by distance $l_2$ and $l_3$. On a second surface of each stamp base section are one or more posts 106. In this example, each stamp base section has nine posts in a 3×3 array. As there are 9 stamp base sections in the example shown in FIG. 2A, the stamp provides a total of 81 stamp posts and so can be used to transfer 81 device coupons from a device wafer to a platform wafer (for example an SOI wafer). The distances $l_2$ and $l_3$ may be at least 50 μm and no more than 100 μm.

Figure 2B:
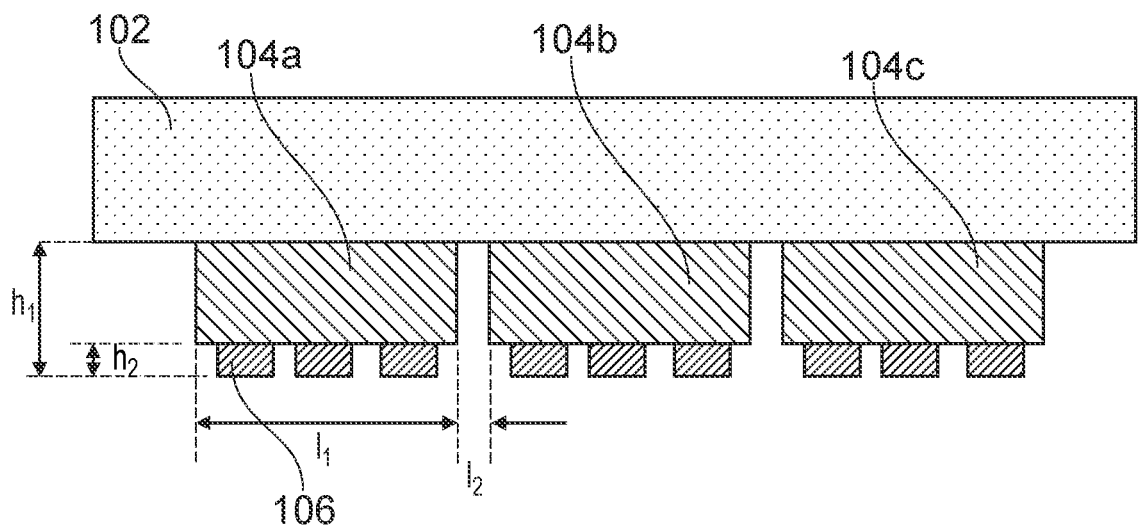
FIG. 2B shows a cross-sectional view of the stamp of FIG. 2A along the line A-A'.

FIG. 2B shows a cross-sectional view of the stamp of FIG. 2A along the line A-A'. Like features are indicated by like reference numerals. As shown in this figure, each stamp base section 104a-104c and its corresponding stamp post(s) extends a height $h_1$ from the carrier layer 102. $h_1$ can take a value of at least 3 mm and no more than 4 mm. The stamp posts themselves extend a height $h_2$ from its respective stamp base section, and $h_2$ can take a value of at least 50 μm and no more than 100 μm. The stamp base sections themselves have a width, $l_1$, which may be at least 1 mm and no more than 5 mm.

Figure 3A:
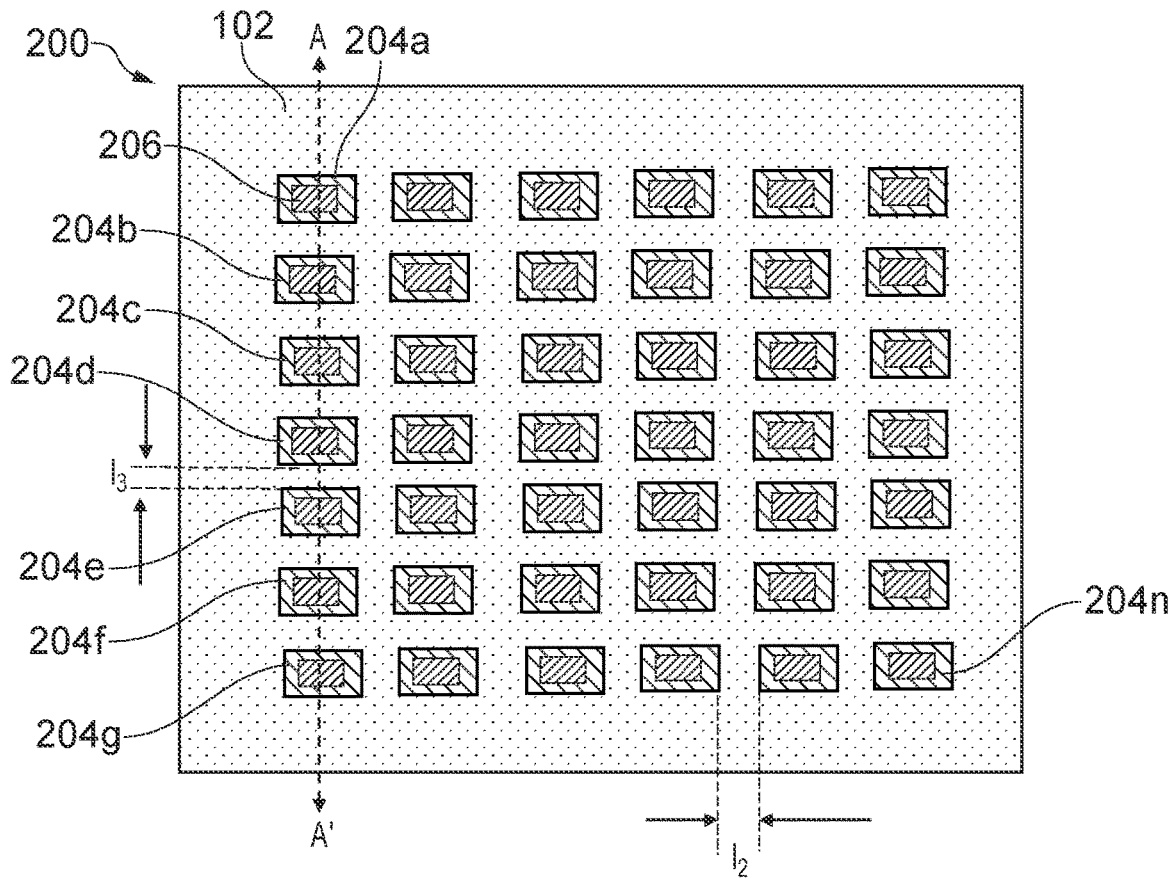
FIG. 3A shows a bottom-up view of a variant stamp according to an embodiment of the present invention.

FIG. 3A shows a bottom-up view of a variant stamp 200 according to an embodiment of the present invention. Again, in this example, the stamp comprises a carrier layer 102 formed from glass with a CTE of less than $1 \times 10^{-5} K^{-1}$. The carrier layer is attached to a plurality of stamp base sections 204a-204n, arranged in a 6×7 array. In this example, each stamp base section contains only a single stamp post 206 for a total of 42 total stamp posts. In this example, the alignment is improved that in FIG. 2A as the expansion of each stamp post is less noticeable. However this comes at the expense of the overall density of stamping posts. In both examples, the stamp posts can be formed from PDMS. The stamp base sections are separated by distances $l_2$ and $l_3$, which may be the same or may be respectively different. In this example, they are different with $l_2$ being larger than $l_3$. Both $l_2$ and $l_3$ may be at least 50 μm and no more than 100 μm.

Figure 3B:
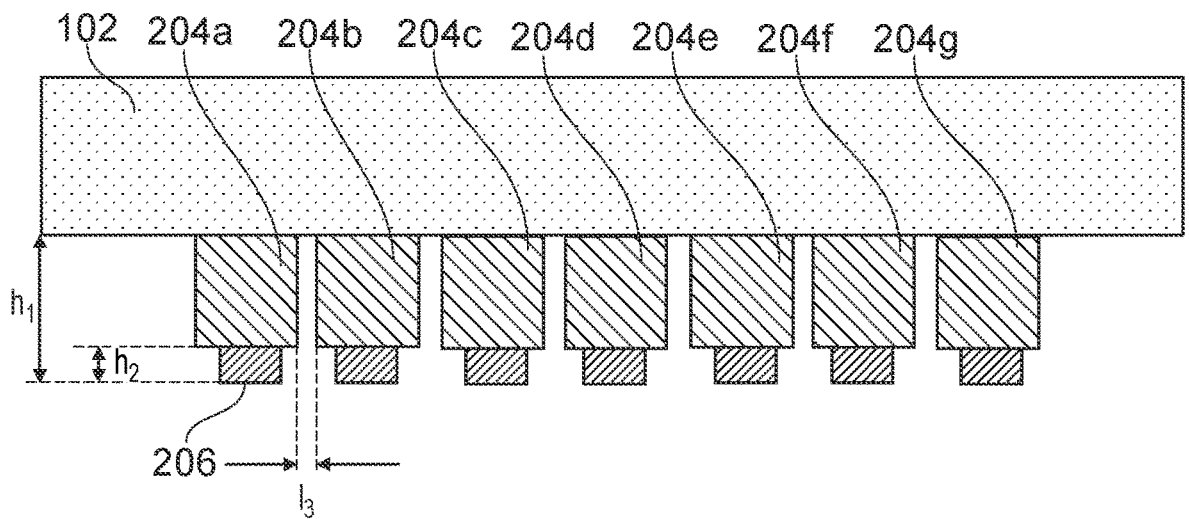
FIG. 3B shows a cross-sectional view of the variant stamp of FIG. 3A along the line A-A'.

FIG. 3B shows a cross-sectional view of the variant stamp of FIG. 3A along the line A-A'. Like features are indicated by like reference numerals. As shown in this figure, each stamp base section 204a-204g and its corresponding stamp post extends a height $h_1$ from the carrier layer 102. $H_1$ can take a value of at least 3 mm and no more than 4 mm. The stamp post for each stamp base section extends a height $h_2$ from its respective stamp base section, and $h_2$ can take a value of at least 50 μm and no more than 100 μm.

In use, the stamp of either FIG. 2A or 3A is placed on top of a device wafer such that the stamp posts are in contact with respective device coupons on the device wafer. The stamp posts adhere to the respective device coupons, and the entire stamp is then lifted away severing the connection between the device coupons and the device wafer, in a manner known per se in the art. The stamp is then placed on top of a host wafer, such as a SOI wafer, and the device coupons (now residing on the stamp posts) are deposited onto the SOI wafer.

A method of preparing the stamp of either FIG. 2A or 3A involves the use of a mould. The mould includes the carrier layer, and a fixed layer defining a shape of the plurality of stamping posts and a stamp base precursor. The mould is then filled with liquid precursor which fills pre-etched cavities (the cavities providing the stamp posts). The liquid precursor is then solidified to form a solid stamp precursor attached to the carrier layer, and material is removed from the solid stamp precursor to define the plurality of stamp base sections with gaps therebetween.

The features disclosed in the description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

The invention claimed is:

1. A stamp, suitable for use in a micro-transfer printing process, the stamp comprising:
   a carrier layer; and
   a plurality of stamp base sections,
   wherein:
      each of the plurality of stamp base sections is attached on a first surface to the carrier layer, and separated from each adjacent stamp base section of the plurality of stamp base sections by a gap; and
      each of the plurality of stamp base sections includes one or more stamping posts, for adhering to a source coupon, each of the one or more stamping posts extending from a second surface of the respective stamp base section,
   wherein the one or more stamping posts of the respective stamp base section are arranged in a post array, and each of the one or more stamping posts of the respective stamp base section is separated from the stamping posts of the adjacent stamp base sections by a stamping post gap, and
   wherein each of the stamping post gaps between the stamping posts of the adjacent stamp base sections are respectively different sizes.

2. The stamp of claim 1, wherein each of the gaps between each of the adjacent stamp base sections is a same size.

3. The stamp of claim 1, wherein each of the gaps between each of the adjacent stamp base sections are respectively different sizes.

4. The stamp of claim 1, wherein the stamp base sections are arranged in a stamp base array.

5. The stamp of claim 4, wherein the gaps between each of the adjacent stamp base sections align to define a plurality of streets through the stamp base array.

6. The stamp of claim 1, wherein the one or more stamping posts attached to each second surface of each of the stamp base sections include only one stamping post.

7. The stamp of claim 6, wherein each stamping post is attached to the second surface of a respective stamp base section in a central position on the second surface.

8. The stamp of claim 1 wherein the one or more stamping posts attached to each second surface of each of the stamp base sections include a plurality of stamping posts.

9. The stamp of claim 8, wherein a number of the plurality of stamping posts attached to each of the second surfaces of each of the stamp base sections is the same.

10. The stamp of claim 9, wherein the pluralities of stamping posts respectively attached to each second surface of each of the stamp base sections are arranged in a same array pattern.

11. The stamp of claim 8, wherein a number of the plurality of stamping posts attached to each of the second surfaces of each of the stamp base sections is respectively different.

12. The stamp of claim 1, wherein each of the stamp base sections has respectively different cross-sectional areas, each cross-sectional area being an area of the second surface of each of the stamp base sections, wherein the cross-sectional area is measured in a direction perpendicular to a direction in which the one or more stamping posts extends.

13. The stamp of claim 1, wherein each of the stamp base sections have respectively different volumes.

14. The stamp of claim 1, wherein the carrier layer is formed from a glass.

15. The stamp of claim 1, wherein a coefficient of thermal expansion of the carrier layer is not more than $1 \times 10^{-5}$ $K^{-1}$.

16. The stamp of claim 1, wherein each of the stamp base sections is formed from polydimethylsiloxane, PDMS.

17. The stamp of claim 1, wherein the one or more stamping posts is formed from polydimethylsiloxane, PDMS.

18. A method of preparing the stamp of claim 1, the method comprising the steps of:
- depositing a liquid precursor into a mould, the mould comprising the carrier layer and a fixed layer defining a shape of the plurality of stamping posts and a stamp base precursor;
- wherein on one sidewall of the mould, the carrier layer contacts the liquid precursor to form the stamp base precursor and on the opposite sidewall of the mould, the fixed layer, containing pre-etched cavities, contacts the liquid precursor to form the stamping posts;
- solidifying the liquid precursor to form a solid stamp precursor attached to the carrier layer;
- removing material from the solid stamp precursor to define the plurality of stamp base sections with gaps therebetween; and
- the method forming the stamp of claim 1.

* * * * *